United States Patent
Hutchinson et al.

(10) Patent No.: US 7,299,575 B2
(45) Date of Patent: Nov. 27, 2007

(54) SYSTEM AND METHOD FOR NON-MECHANICAL INFORMATION HANDLING SYSTEM PRODUCT BADGE ORIENTATION

(75) Inventors: David F. Hutchinson, Round Rock, TX (US); Charles D. Hood, Cedar Park, TX (US); Randall T. Smith, Liberty Hill, TX (US)

(73) Assignee: Dell Products L.P., Round Rock, TX (US)

( * ) Notice: Subject to any disclaimer, the term of this patent is extended or adjusted under 35 U.S.C. 154(b) by 752 days.

(21) Appl. No.: 10/890,017

(22) Filed: Jul. 13, 2004

(65) Prior Publication Data

US 2006/0012949 A1    Jan. 19, 2006

(51) Int. Cl.
*G09F 13/00* (2006.01)
(52) U.S. Cl. .......................... 40/443; 40/463
(58) Field of Classification Search ............. 40/443, 40/463; 340/7.55, 7.61, 7
See application file for complete search history.

(56) References Cited

U.S. PATENT DOCUMENTS

| | | | | |
|---|---|---|---|---|
| 1,441,439 A | * | 1/1923 | Lorenzen .................... 312/8.5 |
| 1,881,417 A | * | 10/1932 | Hodgkin ....................... 40/443 |
| 5,144,328 A | * | 9/1992 | Blake et al. .................. 347/101 |
| 5,279,424 A | * | 1/1994 | Britz et al. ................... 209/170 |
| 5,642,102 A | * | 6/1997 | Panther et al. .............. 340/7.55 |
| 6,204,777 B1 | * | 3/2001 | Lyons ......................... 340/908 |
| 6,477,799 B1 | | 11/2002 | Erickson et al. .............. 40/406 |
| 6,792,293 B1 | * | 9/2004 | Awan et al. ................. 455/566 |

* cited by examiner

*Primary Examiner*—Cassandra Davis
(74) *Attorney, Agent, or Firm*—Hamilton & Terrile, LLP; Robert W. Holland

(57) ABSTRACT

A product badge coupled to a product, such as an information handling system, displays product information to align with a selected of plural product orientations by illuminating a first display material to present the product information in a first orientation associated with a first product orientation and a second display material to present the product information in a second orientation associated with a second product orientation. For instance, illumination by a backlight presents the product information in the first orientation by interacting with the first display material, and suspension of illumination by the backlight presents the product information in the second orientation by allowing reflective light to interact with the second display material. Selection of illumination is automatically or manually accomplished. In one embodiment, a portable information handling system display backlight illuminates the badge when power is applied to the display to automatically alter the display orientation based on display lid position and display use.

13 Claims, 3 Drawing Sheets

SYSTEM AND METHOD FOR NON-MECHANICAL INFORMATION HANDLING SYSTEM PRODUCT BADGE ORIENTATION

BACKGROUND OF THE INVENTION

1. Field of the Invention

The present invention relates in general to the field of information handling system product badges, and more particularly to a system and method for non-mechanical adjusting of product badge orientation to match information handling system orientation.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems have become fixtures in many homes and businesses, fitting into a variety of physical locations having various space constraints. Desktop, tower and server information handling systems are often placed in a variety of orientations depending upon the space available in a given area of use and other factors, such as the proximity of power and network connections. As a result, information handling system manufacturers have designed information handling systems to reliably operate regardless of orientation, such as horizontal or vertical orientations. Indeed, information handling system manufacturers often include stands that support a given information handling system in different orientations so that a user may securely place the information handling system in a desired orientation with reduced risk of damage from falling over. Thus, for instance, desktop information handling systems that are generally designed to rest horizontally on a desk are often instead placed in a vertical orientation under a desk.

One difficulty with the different orientations used with information handling systems is that product badges that identify the manufacturer brand, model or other information are typically affixed to the outer surface of the information handling system in a single orientation. If a product badge is affixed to appear upright with a horizontal orientation, then the badge will appear sideways when the information handling system rests in a vertical orientation, and vise versa. Product badges typically carry brand logos that identify the manufacturer of the information handling system. Brand logos are typically used to build an identity for the user of the information handling system with the manufacturer on the brand, such as by associating a positive user experience with the manufacturer. For instance, to enhance the effect of the brand appearance, information handling systems sometimes utilize a logo on a backlit transflective film that appears bright when power is applied to the backlight, such as by illuminating a logo with a display light when the display is powered. Such film applications are similar to transflective films on automotive dashboards that used to provide a warning light or other icon by illuminating a backlight behind the film. The appearance of the logo in different orientations interferes with the building of brand identity.

One recent innovation for realigning information handling system product badges uses mechanical movement of the product badge to match the orientation of the information handling system, such as is disclosed in U.S. patent application Ser. No. 10/760,818, entitled "Information Handling System Product Badge Orientation System and Method," filed on Jan. 20, 2004 by David J. Hernandez, Pedro M. Alfonso, Bradley Jackson and Kenneth Musgrave, and assigned to Dell Products L.P. However, such mechanical systems generally take more space than conventional product badges and are sometimes prone to failure due to breakage of mechanical components. The size of the badge orientation system is a consideration for its inclusion in smaller information handling systems, such as portable information handling systems. Failure of mechanical components is also a consideration in portable systems that are frequently moved to various orientations. For instance, a product badge on the outer surface of a portable information handling system lid that appears upright to a user with the lid in the closed position will appear upside down once the lid is opened to expose a display on the inner surface of the lid. Portable information handling systems are subject to frequent lid actuation so that a mechanical system incorporated in the lid to alter the product badge orientation would have to have substantial durability to avoid failure after multiple actuations.

SUMMARY OF THE INVENTION

Therefore a need has arisen for a system and method which non-mechanically alters the orientation of an information handling system product badge.

In accordance with the present invention, a system and method are provided which substantially reduce the disadvantages and problems associated with previous methods and systems for coupling a product badge to an information handling system. A product badge activates non-mechanically to present product information of a product badge in desired orientations based on the product's orientation.

More specifically, a product badge support fixedly couples to a product surface, such as at the outer surface of an information handling system housing, to present product information, such as a manufacturer logo or identification number, at selectable orientations. A first transreflective material presents the product information in one orientation with light that reflects through the front of the product badge and a second transflective material presents product information in another orientation with illumination from a backlight that also suppresses display by the first transreflective material. The backlight is selectively powered so that the backlit transflective material is illuminated when the product orientation aligns with the orientation of the product information presented by the backlight material. Selective power application is performed by an orientation selector, such as a mount switch, a tilt switch or a manual interface. Alternatively, the backlight is supplied by an existing lighting system of the product, such as the backlight of a portable information handling system LCD panel display.

The present invention provides a number of important technical advantages. One example of an important technical advantage is that product badge orientation is automatically and non-mechanically adjusted to various orientations of the product. Information handling system product brand logo orientation matches information handling system orientation to improve appearance and build user identity with a manufacturer brand. The use of visual effects to orient a product badge with a product reduces or eliminates the need for mechanical movement to the product badge for reduced space use and reduced risk of mechanical failure of moving components.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Non-mechanical orientation of an information handling system product badge aligns product information presented by the badge for a desired appearance with different information handling system orientations. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
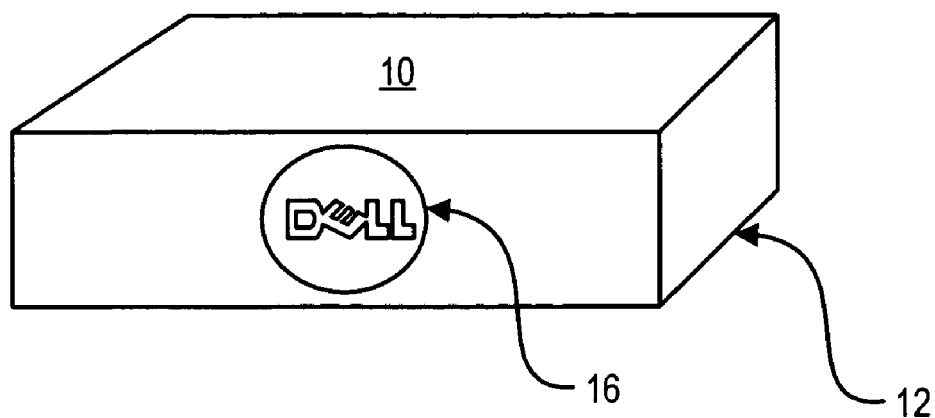
FIG. 1 depicts an information handling system in a horizontal desktop orientation.
Figure 2:
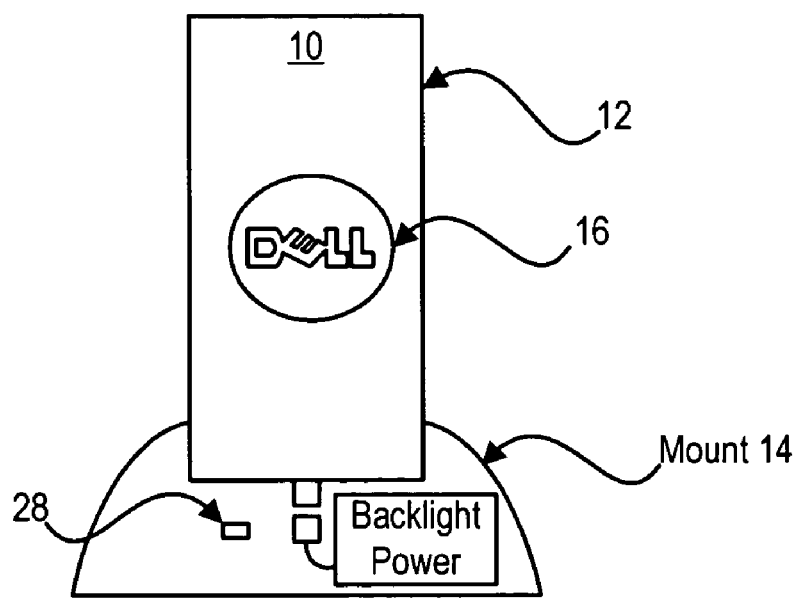
FIG. 2 depicts an information handling system in a vertical tower orientation.

Referring now to FIG. 1, a top perspective view of an information handling system 10 is depicted in a horizontal desktop configuration. For instance, information handling system 10 is a desktop system adapted to rest on a user's desktop underneath a monitor with the outer housing 12 protecting processing components, such as processors and memory, that process information for display to a user. However, as is depicted by FIG. 2, information handling system 10 is also adapted to rest in a vertical tower configuration supported in a mount 14. In the horizontal configuration, a product badge 16 having the "DELL" logo is displayed to align in a horizontal appearance. However, if information handling system 10 is rotated to a vertical configuration as depicted by FIG. 2 without rotating product badge 16, the logo of product badge 16 would also rotate to a vertical appearance that disrupts the intended appearance of the logo. Similarly, a product badge 16, depicted in FIGS. 1 and 2 at the front of information handling system 10 but usually located at the rear, rotates from horizontal to vertical appearances to make the identification number or other product information on product badge 16 more difficult to read. Automated non-mechanical rotation of the orientation of product information displayed by product badge 16 allows an upright appearance of the product information that adapts to changes in the orientation of information handling system 10.

Figure 3:
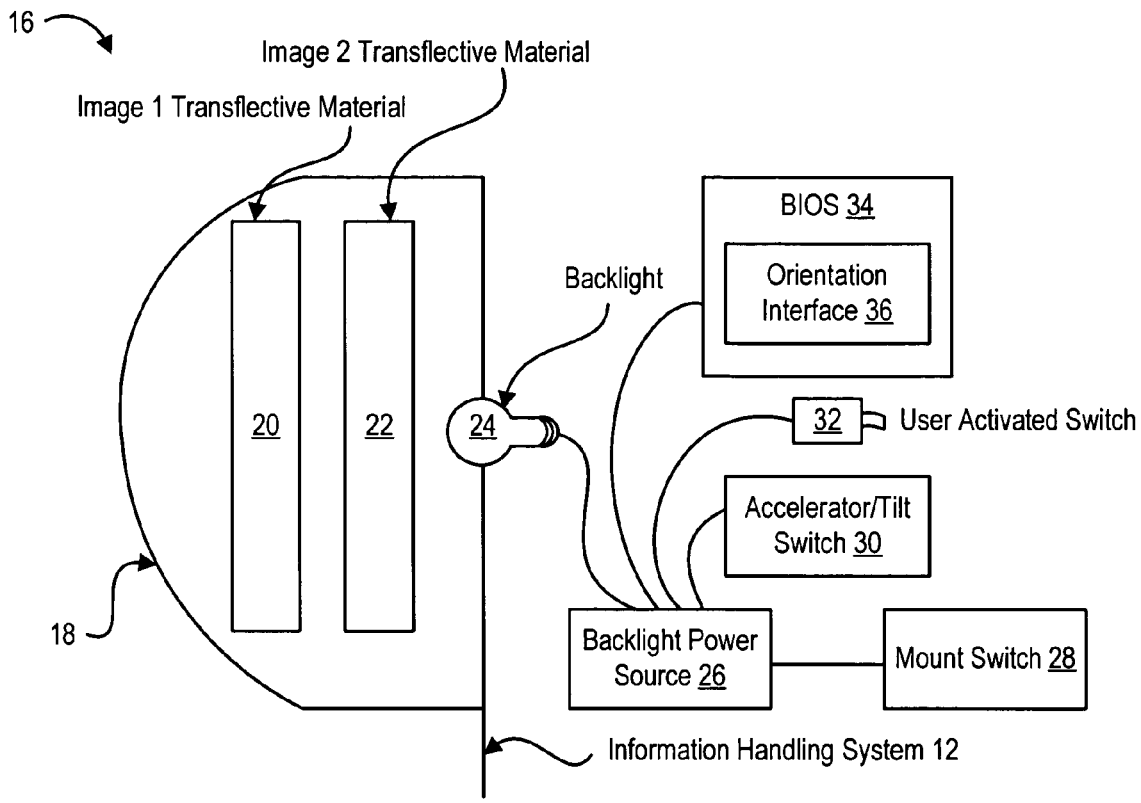
FIG. 3 depicts a product badge having product information displayed in backlit or reflective orientations based upon selective illumination of a backlight.

Referring now to FIG. 3, one embodiment of a product badge 16 is depicted that automatically and non-mechanically alters the orientation of displayed product information to align with the orientation of a product. A product badge housing 18 fixedly couples at its back surface with the outer housing surface 12 of information handling system 10 and presents product information, such as the "DELL" logo, at its front surface in one of two product information orientations. As depicted by FIG. 1, the logo is displayed with a horizontal orientation when information handling system 10 is in the horizontal desktop orientation. As depicted by FIG. 2, the logo remains displayed with the horizontal orientation when information handling system 10 is in the vertical tower orientation by rotating the orientation of the product information relative to the orientations of product badge 16 and information handling system 10. Referring again to FIG. 3, the different product information display orientations are provided by a front-located transreflective display material 20, a back-located transflective display material 22 and selective powering of a backlight 24. Front lit transflective material 20 presents product information in one orientation by interaction with light entering through the front of housing 18 and reflecting from the material. Backlit transflective material 22 presents product information in a second orientation by illumination with backlight 24 through the material. Illumination of backlight 24 suppresses the presentation of product information by transreflective material 20.

Backlight 24 is selectively powered with a backlight power source 26 by an orientation selector, such as a mount switch 28, accelerometer/tilt switch 30, manual selection switch 32 or processing component controlled interface like orientation interface 36 supported by the information handling system BIOS 34. Mount switch 28 detects insertion of information handling system 10 into mount 14, such as with a plunger that activates by the weight of information handling system 10 or an electrical connection that completes a circuit. Activation of mount switch 28 may turn the backlight on or off, depending upon the orientation of the product information of the backlight material with the information handling system. Accelerometer/tilt switch 30 detects gravitational acceleration to determine the orientation of information handling system 10 and applies or suspends power to backlight 24 to present the product information with an appropriate alignment to the information handling system orientation. User activated switch 32 allows manual user selection of product information alignment, such as with a power switch integrated in the product badge. Similarly, orientation interface 36 allows user selection of product information orientation by CMOS control of backlight power application.

Figure 4:
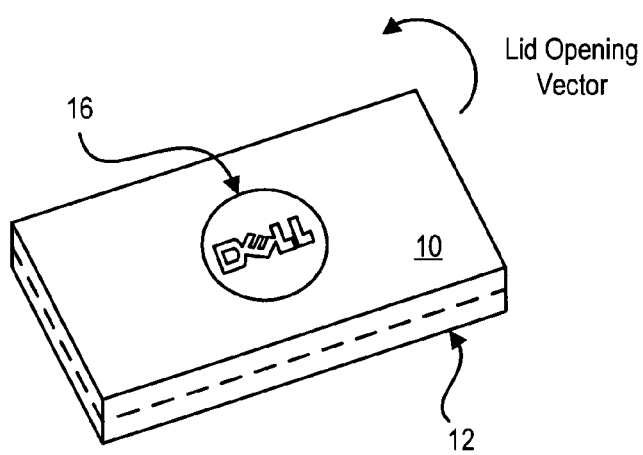
FIG. 4 depicts a portable information handling system in a closed position.
Figure 5:
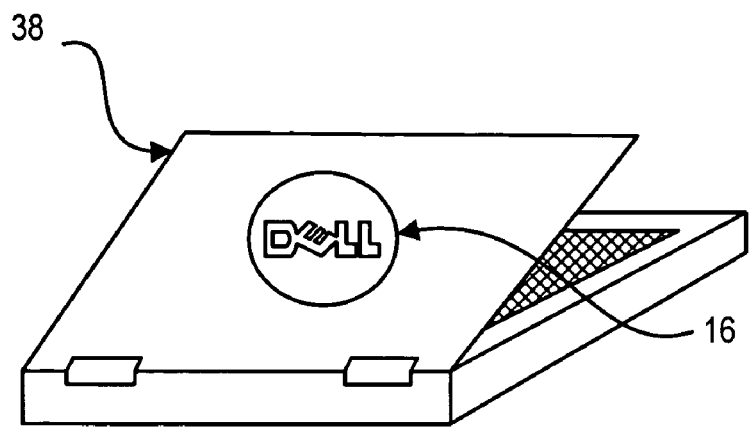
FIG. 5 depicts a portable information handling system in an open position.
Figure 6:
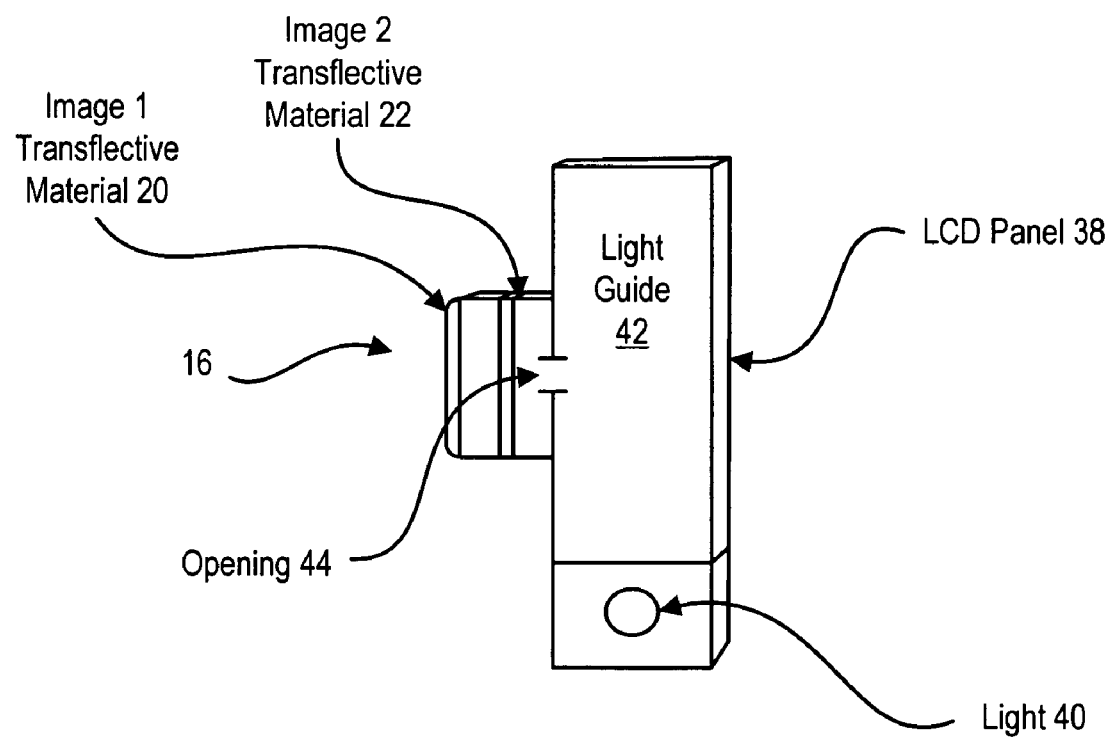
FIG. 6 depicts a product badge selectively illuminated with a portable information handling system LCD panel light.

In one embodiment, backlit material 22 is selectively illuminated by directing existing backlight to the material. Referring now to FIGS. 4 and 5, a portable information handling system 10 is depicted having a housing 12 that pivots from a closed position to an open position with the open position exposing an LCD panel 38. In the closed position depicted by FIG. 4, product badge 16 is affixed to housing 12 to face the user as the user prepares to open the lid. If the orientation of product badge 16 is unchanged as the lid is opened, the product information will appear inverted. However, as depicted by FIG. 5, by altering the orientation of the product information by 180 degrees when the lid is open, the product information appears in an upright orientation. Referring now to FIG. 6, the selection of the product information orientation is automatically determined based on lid position by using the light 40 of LCD panel 38 to illuminate product badge 16 when LCD panel 38 is open and powered. LCD panel light 40 provides light to LCD panel 38 through a light guide 42. Illumination of LCD panel 38 automatically illuminates product badge 16 through an opening 44 so that backlit material 22 presents the product information with a desired orientation.

Although the present invention has been described in detail, it should be understood that various changes, substitutions and alterations can be made hereto without departing from the spirit and scope of the invention as defined by the appended claims.

What is claimed is:

1. An information handling system comprising:
   a housing having an outer surface;
   processing components disposed within the housing and operable to process information;
   a product badge having product information and coupled to the housing at the outer surface, the product badge having a first material displaying the product information at a first orientation and a second material displaying the product information at a second orientation; and
   a backlight aligned with the product badge, the backlight operable to illuminate the first material with the housing in the first orientation to display the product information in the first orientation and to reduce illumination with the housing in the second orientation to display the product information in the second orientation.

2. The information handling system of claim 1 wherein the housing comprises a portable housing having a hinged lid and a display disposed in the lid and operable to present an image, the display having a backlight to illuminate the image, the backlight exposed to illuminate the product badge during illumination of the image.

3. The information handing system of claim 2 wherein the first orientation presents the product information in a vertically upright orientation with the lid open.

4. The information handling system of claim 3 wherein the second orientation presents the product information in an orientation upright to a user positioned to open the lid.

5. The information handling system of claim 1 further comprising:
   a backlight power source interfaced with the backlight and operable to selectively power the backlight; and
   an orientation selector interfaced with the backlight power source and operable to power the backlight with the housing in the first orientation and to suspend power to the backlight with the housing in the second orientation.

6. The information handling system of claim 5 wherein the orientation selector comprises a tilt switch operable to detect housing orientation by reference to gravitational acceleration.

7. The information handling system of claim 5 wherein the orientation selector comprises an orientation interface presented to a user by the processing components.

8. The information handling system of claim 5 further comprising a mount operable to support the housing in a mount orientation associated with one of the first or second orientations and wherein the orientation selector comprises a mount switch disposed in the housing and operable to engage the mount to detect the housing in the mount orientation.

9. The information handling system of claim 1 wherein the product badge is a brand logo.

10. A product badge for presenting product information aligned with a selected of plural product orientations, the product badge comprising:
   a product badge housing having a front and a back, the back operable to fixedly couple to a product in an orientation, the product moveable between plural product orientations;
   a first material coupled to the product badge housing and operable to display the product information in a first orientation in response to a first light source, the first orientation associated with a first of the plural product orientations;
   a second material coupled to the product badge housing and operable to display the product information in a second orientation in response to a second light source, the second orientation associated with a second of the plural product orientations; and
   an orientation selector interfaced with at least the first light source and operable to illuminate the first light source if the product in the first orientation.

11. The product badge of claim 10 wherein the first light source comprises a light disposed at the back of the housing.

12. The product badge of claim 11 wherein the first light source further comprises a portable information handling system display back light.

13. The product badge of claim 11 wherein the second light source comprises reflected light entering the front of the product badge housing.

* * * * *